United States Patent [19]

Lutz

[11] Patent Number: 4,837,571
[45] Date of Patent: Jun. 6, 1989

[54] CIRCUIT ARRANGEMENT FOR CONVERTING A DATA SIGNAL

[75] Inventor: Georg Lutz, Heinersreuth, Fed. Rep. of Germany

[73] Assignee: U.S. Philips Corporation, New York, N.Y.

[21] Appl. No.: 101,914

[22] Filed: Sep. 28, 1987

[30] Foreign Application Priority Data

Sep. 26, 1986 [DE] Fed. Rep. of Germany ....... 3632682

[51] Int. Cl.$^4$ ............................................. H03M 7/40
[52] U.S. Cl. ....................................... 341/67; 341/55; 341/61
[58] Field of Search ................... 340/347 DD; 341/50, 341/55, 61, 67

[56] References Cited

FOREIGN PATENT DOCUMENTS 3510901.7  3/1985  Fed. Rep. of Germany .

Primary Examiner—William M. Shoop, Jr.
Assistant Examiner—Richard K. Blum
Attorney, Agent, or Firm—Thomas A. Briody; Jack E. Haken; Anne E. Barschall

[57] ABSTRACT

The described circuit arrangement for converting a data signal having a constant bit rate and code words of different length into an output signal consisting of code words of constant length but with a variable bit rate while using a buffer memory comprises a first encoder which recognizes code words of the data signal and converts them into code words of equal length, said code words being written in the buffer memory, read out from this memory by a second encoder and being converted into code words of the output signal. The construction of the first encoder is characterized in that a first EPROM and a comparator are connected to the parallel outputs of a shift register through which the data signal with its bit clock is shifted. The output data of the first EPROM and of the comparator are transferred to an intermediate memory and simultaneously applied to the address inputs of a second EPROM. Among the outputs of the second EPROM there is an output at which pulses for the transfer of the output data of the first EPROM and of the comparator in the intermediate memory are present. The second EPROM generates erasing pulses for a counter whose stages are connected to inputs of the second EPROM. Among the output data of the second EPROM there are control signals with which logic circuits are controlled which convert the control signals into code words of equal length and pass them on to the buffer memory.

5 Claims, 2 Drawing Sheets

CIRCUIT ARRANGEMENT FOR CONVERTING A DATA SIGNAL

BACKGROUND OF THE INVENTION

1. Field of the Invention

The invention relates to a circuit arrangement for converting a data signal having a constant bit rate and code words of different length into an output signal consisting of code words of constant length but with a variable bit rate while using a buffer memory, in which arrangement a first encoder is provided which recognizes the code words of the data signal and converts them into code words of equal length and in which these code words are written in the buffer memory, read out from this memory by a second encoder and converted into code words of the output signal.

2. Prior Art

A circuit arrangement of this type is described in German Patent Application No. P 35 10.901.7 It is used, for example for decoding received video data and the associated control words which are transmitted as a code word sequence consisting of code words of variable length in order to maintain the bit rate of the transmission signal as small as possible. FIG. 1 shows a basic circuit diagram of the above-mentioned circuit arrangement.

A received data signal DS consisting of video data and control words and the bit clock T of the data signal are applied to a first encoder U1 via input terminals. The bit rate of the data signal DS is 2 Mbit/s. The encoder U1 which is in the form of a fast microprocessor in accordance with the above-mentioned German Patent Application recognizes the words of unequal length in the received data signal DS and converts them into 10-bit code words. These 10-bit code words are written in a buffer memory PS by means of a write clock TS. The specification for converting the data signal into the 10-bit code words is chosen to be such that the 10-bit code are to be changed to a slight extent in order to obtain the code words of the data signal in the ultimately required form. The video data and control words are not separated at this point.

The code words of the data signal acquire their ultimate form by means of a second encoder U2 which reads the 10-bit code words by means of a read clock TL from the buffer memory PS and converts them into code words of the output signal.

The code words of the output signals are present in a parallel form at the output terminals of the second encoder U2. The video data and control words are separated in such a way that the decoded video data DVD can be derived from eight output terminals, whilst the decoded control words SS are present at the remaining output terminals. This separation mode results from the conversion table in the second encoder U2 formed as an EPROM.

As stated above, the first encoder U1 in the above-mentioned Patent Application is in the form of a microprocessor whose function is essentially determined by the programs stored in its associated program memory.

SUMMARY OF THE INVENTION

It is an object of the invention to provide an encoder consisting of single units, taking over the function of the first encoder in a circuit arrangement of the type described in the opening paragraph.

This object is solved in that the first encoder comprises a shift register through which the data signal with its bit clock is shifted, in that inputs of a first EPROM and inputs of a comparator are connected to parallel outputs of the shift register, in that an output of the first EPROM is connected to the enable input of the comparator which is enabled when a uniform recognition of the code words of the data signal by means of the first EPROM is not possible, in that output data of the first EPROM and of the comparator are transferred to an intermediate memory and are applied to inputs of a second EPROM, in that the clock pulses for transferring the output data of the first EPROM and of the comparator to the intermediate memory are present at an output of the second EPROM, in that a further output of the second EPROM supplies reset pulses for a bit-clock controlled counter whose stages are connected to further inputs of the second EPROM and in that the second EPROM supplies control signals from further outputs, said control signals initiating logic circuit to apply code words of equal length to the buffer memory.

BRIEF DESCRIPTION OF THE DRAWING

The invention will now be described in greater detail with reference to the accompanying drawings in which.

DETAILED DESCRIPTION OF THE PREFERRED EMBODIMENTS

Figure 1:
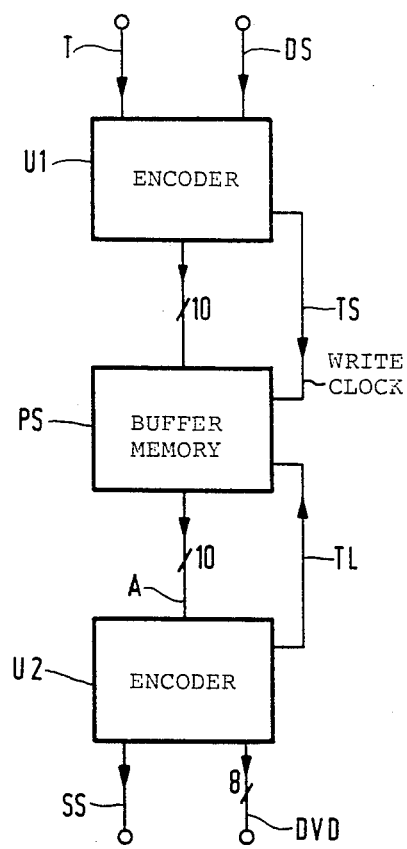
FIG. 1 shows the block diagram of the circuit arrangement according to the invention and FIG. 2 shows an embodiment of the first encoder in a circuit arrangement according to the invention.

The block diagram of FIG. 1 has already been described in prior art embodiments. The single-unit structure of the first encoder U1 according to FIG. 1 which converts code words of different length into code words of equal length is dependent on the manner in which the code words of different length of the data signal to be converted are built up in detail.

Figure 2:
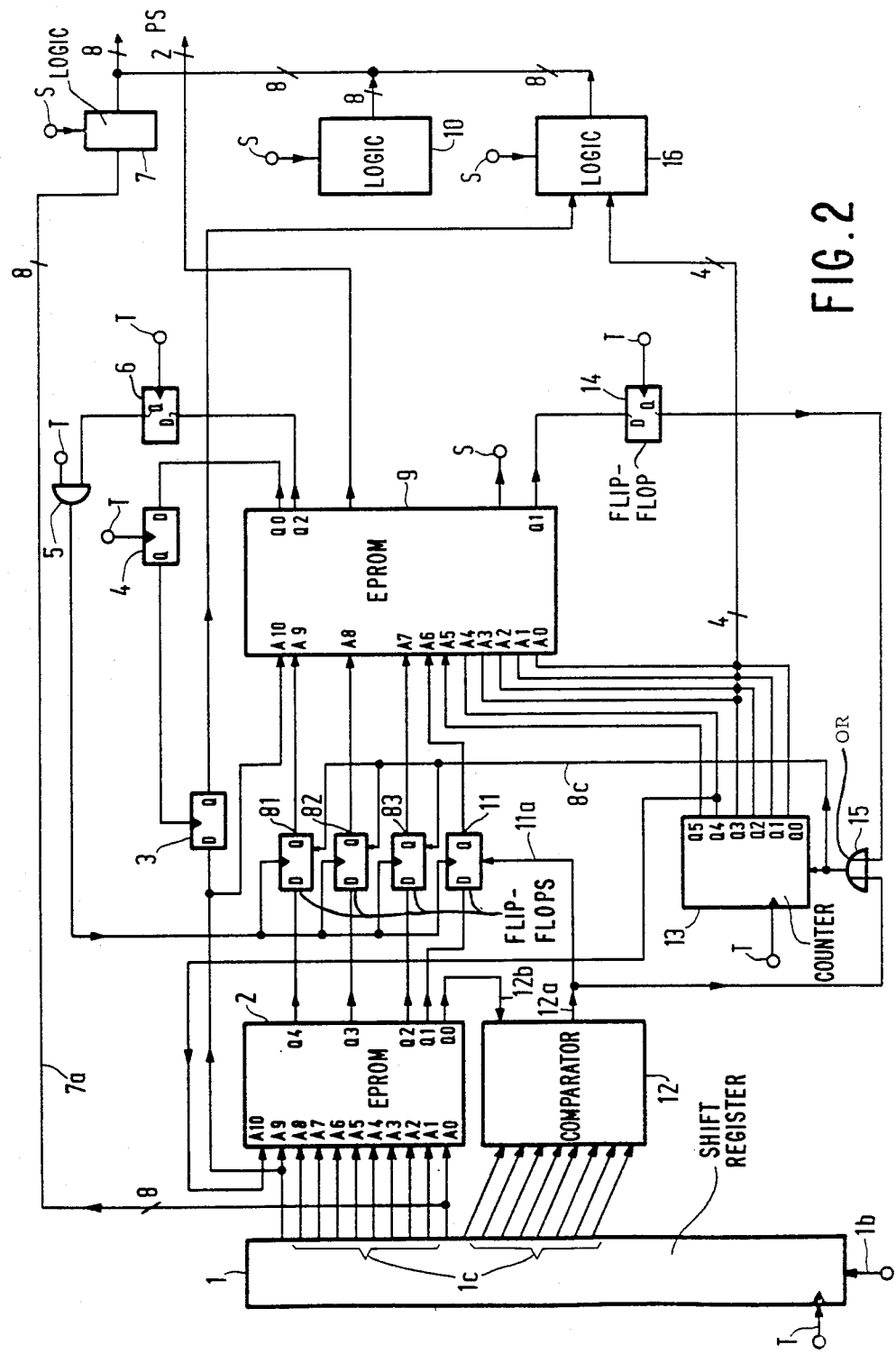

In the encoder according to FIG. 2 the data signal comprises a video signal which is shifted via a line 1b through a shift register 1 with a 2 MHz clock T and which comprises the following code words:

16 line-start code words (LSC words) of 20 bits each;

2 field-start code words (FSC words) of 28 bits each;

a PCM key word (PCK word) informing the receiver that the next video signal line is transmitted in the form of PCM code words;

224 PCM code words of 8 bits each;

256 address words (ADR words) of 8 bits each;

a 4-bit code word, the so-called End-Of-Cluster code word (EOC word);

a colour code word (C code word) of 8 bits informing the receiver that the subsequent data relate to the colour components of the video signal;

16 code words of variable length (VLC words) the first eight of which—with an increasing number of bits—only comprise leading zeroes with a one at the end and the remaining eight—likewise with an increasing bit number—commence and end with a binary one and otherwise comprise zeroes only.

The division of zeroes and ones within the added code words is chosen to be such that, commencing with the first bit of a code word, 17 further bits are sufficient to decide which valid code words are included in the group of 18 bits. The shift register 1 therefore has 18 parallel outputs 1c the first ten of which—viewed in the data flow direction—are connected to the inputs A0 to A9 of an EPROM 2 and the last eight of which are connected to the inputs of a comparator 12. The comparator 12 is only occasionally enabled, more specifically when the bit combination at the inputs A0 to A7 of the EPROM 2 is presumed to comprise an LSC word or an FSC word. The enable signal is applied from an output Q0 of the EPROM 1 via a line 12b to the enable input of the comparator 12. The signal at the output Q0 of the EPROM 2—likewise as the signals at the outputs Q1, Q2, Q3 and Q4 of the EPROM 2—is controlled by the signals at the eleven inputs A0 to A10 of the EPROM 2. The relationship between input and output signals is laid down in the EPROM 2 table.

If the comparator 12 is enabled, eight further bits of the video signal are taken into consideration for confirmation or denial of the above-mentioned presumption. The comparator 12 then compares the further eight bits with a bit combination which is characteristic of LSC or FSC words. The resultant change of state of the encoder according to FIG. 2 is dependent on the comparison result, as will be described hereinafter.

It is hereinafter assumed that the encoder is in the operative state, which specifically means that the outputs Q1 to Q4 of the EPROM 2 are "scanned" when the first bit of a code word is present at its input A7. In this context "scanning" is to be understood to mean that the output variables at the outputs Q1 to Q4 are transferred to the Q outputs of four flipflops 81, 82, 83 and 11.

This transfer is controlled by a second EPROM 9 which supplies clock pulses for the flipflops 81, 82, 83 and 11 from an output Q2. The clock pulses present at the output Q1 of the EPROM 9 are delayed by a flipflop 6 and a gate 5 and synchronized with the bit clock T. After the transfer of the output variables at the outputs Q1 to Q4 to the Q outputs of the flipflops 81, 82, 83 and 11 these variables are also present at the associated inputs A6 to A9 of the EPROM 9. The EPROM 9 now controls—on the basis of its table—the operation of a counter 13 via reset pulses at its output Q1, also in dependence upon variables at its further inputs A0 to A5 and A10. The reset pulses are synchronized on the clock T by a flipflop 14 and applied via an OR-gate 15 to the reset input of the counter 13. On the condition that, based on the information at its inputs A6 to A9, the EPROM 9 uniformly recognizes with which code word the bit present at the input A7 of the EPROM 2 is associated, the length of this code word is also recognized. The reset pulse of the EPROM 9 at the counter 13 is only given when the counter 13 has proceeded through as many counting pulses as there are binary digits in the recognized code word. To inform the EPROM 9 about the position of the counter 13, the stages Q0 to Q5 of the counter 13 are connected to the inputs A0 to A5 of the EPROM 9. If the counter 13 receives a reset pulse, the flipflops 81, 82 and 83 are also reset with the same pulse via a line 8c. In the case of the above-mentioned condition the first bit of the next code word is present at the input A7 of the EPROM 2 after the counter 13 and the flipflops 81, 82 and 83 have been reset; at this instant EPROM 9 also applies a new counting pulse to the flip-flops 81, 82, 83 and 11 so that—in the case of the same condition—the above-mentioned processes are repeated.

The encoder of FIG. 2 converts code words of the video signal into 10-bit code words. The converted code words are passed on in a parallel form to a buffer memory denoted by PS. If the processes are carried out as described hereinbefore, then the code words comprise, for example VLC words which can be uniformly characterized by the value of their bits and by the number of their binary digits. The number of their bits can be derived from the position which the counter 13 has reached before a reset pulse. Since the lower four stages of the counter are sufficient for indicating the length of all VLC words, they are connected to four inputs of a logic circuit 16 to which, additionally to the contents of flipflops 3 and 4 received, the values of the most significant bits of a VLC word. The logic circuit 16 is controlled by control signals S of the EPROM 9; it is inter alia caused to combine to a single 8-bit code word and to supply two successive VLC words in which three bits are sufficient to characterize their length. If this combination is not possible, the logic circuit 16 still supplies an 8-bit code word which together with two additional parallel bits of the EPROM 9 is applied to the buffer memory PS.

When the EPROM 9 recognizes the presence of a PCM code word or an address word at the inputs A0 to A7 of the EPROM 1, a further logic circuit 7 is controlled via the control signal S, the inputs of said logic circuit being connected in parallel to the inputs A0 to A7 of EPROM 1 via lines 7a. The logic circuit 7 then passes on the 8-bit code word from its output whence it reaches the buffer memory PS together with two further bits of the EPROM 9.

When an LSC word or an FSC word is present at the inputs of EPROM 2, the comparison with the contents of the first eight stages of the shift register 1 is positive after enabling the comparator 12. The counter 13 and the flipflops 11, 81, 82 and 83 are then reset via sublines 12a, 11a, via the gate 15 and via the line 8c; subsequently there is a waiting time of at least 16 shift pulses, which are simultaneously counting pulses, until the still unchecked bits of an LSC or FSC word are present at inputs of EPROM 2. With the information now available and the evidence that the counter 13 has reached position 16—this evidence can be derived from the binary digit one in the fourth stage of the counter 13 whose output Q4 is connected to the input A10 of EPROM 2—the EPROM 9 is capable of distinguishing between LSC and FSC words. A third logic circuit 10 is then controlled via the control signal S, which logic circuit generates an 8-bit code word comprising the same information as an LSC or an FSC word and passes it on, together with two additional bits, to the buffer memory PS.

What is claimed is:

1. A circuit arrangement for converting a data signal having a constant bit rate and code words of varying length into an output signal having code words of constant length and a variable bit rate, the circuit arrangement comprising:
   a. a first encoder, for recognizing the code words of the data signal and converting them into code words of equal length, comprising:
      i. an output at which the code words of equal length are supplied;
      ii. a shift register having
         A. an input for receiving the data signal so that the data signal is shifted through the shift register; and
         B. a plurality parallel outputs;
      iii. a first memory having:

A. parallel inputs coupled with the parallel outputs of the shift register;
B. a first output, at which a signal is supplied when a uniform recognition of the code words of the data signal is not possible in the first memory;
C. a second output;
iv. a comparator having:
A. parallel inputs coupled with the parallel outputs of the shift register;
B. an enable input coupled with the output of the first memory, so that the comparator is enabled when the uniform recognition is not possible;
C. output means;
v. an intermediate memory, for receiving data from the first memory and from the comparator;
vi. a second memory having
A. a plurality of inputs for receiving data from data from the intermediate memory;
B. a clock output for supplying clock pulses for timing transferring data from the first memory and the comparator to the intermediate memory;
C. a second output for supplying reset pulses;
D. a plurality of further inputs;
E. a plurality of further outputs, for supplying control signals;
vii. a bit-clock controlled counter having a plurality of stages coupled with the further inputs of the second memory, the bit-clock controlled counter being reset by the reset pulses from the second output of the second memory;
viii. logic means for supplying code words of equal length to the output of the first encoder under control of the control signals from the plurality of further outputs of the second memory;
b. a buffer memory coupled to receive the code words of equal length from the first encoder; and
c. a second encoder for reading the buffer memory and having an output at which the output signal of the arrangement is provided.

2. The arrangement of claim 1 wherein the intermediate memory comprises at least one flipflop which is clock-controlled by the clock pulses.

3. The arrangement of claim 2 wherein the logic means comprises means for directly passing a PCM or similar code word in parallel from the shift register to the buffer memory under control of the control signals.

4. The arrangement of claim 1 wherein the logic means comprises means for directly passing a PCM or similar code word in parallel from the shift register to the buffer memory under control of the control signals.

5. The arrangement of claim 1, 2, 3, or 4 wherein the logic means comprises:
a logic circuit, having inputs coupled to the stages of the counter, for converting a position of the counter together with additional information, under control of the control signals, into code words of equal length, the logic circuit having output means coupled with the buffer memory so that the code words of equal length are passed directly to the buffer memory.

* * * * *